(12) United States Patent
Bumbalough et al.

(10) Patent No.: US 8,825,458 B2
(45) Date of Patent: Sep. 2, 2014

(54) METHOD, COMPUTER PROGRAM PRODUCT AND APPARATUS FOR PROVIDING A MODEL MAP FOR WORKFLOW INTEGRATION

(75) Inventors: Steven Eugene Bumbalough, Arlington, TX (US); Chris Arps, Allen, TX (US); Alex Vinckier, Destelbergen (BE); Karel Vinckier, Deurle (BE); Kris Riemslagh, Evergem (BE); Santiago Burbano, Cumbaya (EC); David Tims, Staffordshire (GB)

(73) Assignee: Illinois Tool Works Inc., Glenview, IL (US)

( * ) Notice: Subject to any disclaimer, the term of this patent is extended or adjusted under 35 U.S.C. 154(b) by 223 days.

(21) Appl. No.: 13/243,442

(22) Filed: Sep. 23, 2011

(65) Prior Publication Data

US 2013/0080122 A1    Mar. 28, 2013

(51) Int. Cl.
    *G06G 7/48*    (2006.01)
(52) U.S. Cl.
    USPC ................................. 703/6; 700/98
(58) Field of Classification Search
    USPC ......... 703/1, 6, 7; 705/1, 80; 714/38; 700/98, 700/117; 348/51
    See application file for complete search history.

(56) References Cited

U.S. PATENT DOCUMENTS

| | | | |
|---|---|---|---|
| 2004/0153824 A1* | 8/2004 | Devarajan et al. | 714/38 |
| 2006/0092156 A1 | 5/2006 | Trotta et al. | |
| 2007/0061154 A1* | 3/2007 | Markvoort et al. | 705/1 |
| 2009/0187267 A1* | 7/2009 | Tebboune et al. | 700/117 |
| 2010/0088239 A1* | 4/2010 | Blair et al. | 705/80 |
| 2011/0087350 A1* | 4/2011 | Fogel et al. | 700/98 |
| 2011/0169924 A1* | 7/2011 | Haisty et al. | 348/51 |
| 2011/0213480 A1* | 9/2011 | Zila et al. | 700/98 |
| 2012/0296609 A1* | 11/2012 | Khan et al. | 703/1 |
| 2012/0296610 A1* | 11/2012 | Hailemariam et al. | 703/1 |

OTHER PUBLICATIONS

International Search Report and Written Opinion for Application No. PCT/US11/53936, dated May 31, 2013.
Rappoport, A., *An Architecture for Universal CAD Data Exchange*, [online][retrieved Jun. 21, 2013] Retrieved from: <URL: http://citeseerx.ist.psu.edu/viewdoc/download?doi=10.1.1.5.3591&rep=rep1&type=pdf> 4 pages.
Whyte, J., et al., *From CAD to Virtual Reality: Modelling Approaches, Data Exchange and Interactive 3D Building Design Tools*, [online][retrieved Jun. 21, 2013] Retrieved from: <URL: http://www.civ.utoronto.ca/sect/coneng/tamer/references/1299/look%20at.pdf> 13 pages.

* cited by examiner

*Primary Examiner* — Kandasamy Thangavelu
(74) *Attorney, Agent, or Firm* — Alston & Bird LLP

(57) ABSTRACT

A method, apparatus and computer program product are described for providing a model map for workflow integration from concept to production. The apparatus may receive a file in a first format, produce a mapped file from the file in the first format, and provide for conversion of the mapped file from the mapped format to a second, different format. The file in the first format may be supported by a first application, such as an architectural design application, a design engineering application, or a production specific application. The file in the second format may be supported by a second application, which may include an architectural design application, a design engineering application, or a production specific application. In this way, a file in the first format that is only operable on the first application may be converted to a file in the second format that is operable on the second application.

19 Claims, 6 Drawing Sheets

METHOD, COMPUTER PROGRAM PRODUCT AND APPARATUS FOR PROVIDING A MODEL MAP FOR WORKFLOW INTEGRATION

TECHNOLOGICAL FIELD

Embodiments of the present invention relate generally to computer aided design and building information modeling technology and, more particularly, relate to a method, computer program product and apparatus for providing a model map for workflow integration from concept to production.

BACKGROUND

The modern construction era has brought about a tremendous expansion of the use of technology and computers in connection with designing and building structures of all types. Building Information Modeling (BIM), which is an accurate computer generated representation of a building, is one area that has fueled the expansion of the integration of computers into areas such as building design. In this regard, BIM may be used to increase the productivity and capability of architects and draftsmen to design buildings and produce corresponding engineering drawings and other downstream deliverables. These deliverables can then be easily modified and regenerated by revising the original model.

Production builders are one example of an industry segment that benefits from the advantages that can be offered by BIM. In this regard, for example, production builders typically build a relatively large number of houses from a set of basic plans and then provide various options for buyers to implement according to their budget and desires. Production builders typically receive input from consumers on options they desire and incorporate the options into the building process.

The original plans for a given house may begin with an architect that is responsible for producing the original design. Architects often use computer software to generate their architectural designs. In some cases the architect may use a computer aided design (CAD) application such as, for example, AutoCAD® or another similar application, to prepare design plans. The design plans may then be passed on to engineers (e.g., structural engineers) who may use a different software application to produce trusses, panels, and other structural features that will realize the design prepared by the architect. The structural engineers often use different software applications than those used by architects and therefore generate different file formats for their work on the same building the architect designed.

The structural engineer may design panels, trusses or other structural components and pass those design plans on to manufacturers (e.g., truss or panel builders) who will use the design plans to construct the corresponding structural components. In some cases, the manufacturers may use their own software applications to facilitate their production activities. Accordingly, there may be a number of levels at which different software applications are used to operate on data that is essentially associated with the same building or project.

Currently, there is no full integration of work flow from concept to production. As such, downstream operators typically conform their applications to import material from a level above and modify it for their use. Thus, there is only limited interaction between the levels and such interaction is only in one direction (i.e., top-down) among immediately adjacent levels. Accordingly, there is no file format that is useable at each level and there is no mechanism for feedback to be provided in a reverse direction (i.e., from production to design).

BRIEF SUMMARY

A method, apparatus and computer program product are therefore provided for the provision of a model map for workflow integration from concept to production. In this regard, for example, some example embodiments may provide a model map that incorporates data from any level of the work flow chain into a single file format that is useable at every level. Some embodiments may also provide for the use of a scripting language to enable pre and post processing of certain objects associated with some design features in certain files. Some embodiments may also enable the provision of "smart" components. For example, certain components such as lumber, sheets, metal rods or other building materials may be marked automatically during certain production related operations to facilitate their use in other production related operations.

An example embodiment of a method according to the present invention may include receiving a file in a first format, where the first format is supported by a first application chosen from the group consisting of: an architectural design application, a design engineering application, and a production specific application. The method may further include producing a mapped file from the file in the first format, where the mapped file is in a mapped format. The method may also include providing for conversion of the mapped file from the mapped format to a second format via a processor, where the second format is supported by a second application chosen from the group consisting of an architectural design application, a design engineering application, and a production specific application. The second format may be different from the first format.

According to some embodiments, the mapped file may include an architectural design component, a design engineering component, and a production specific component. The architectural component may be editable in the architectural design application, the design engineering component may be editable in the design engineering application, and the production specific component may be editable in the production specific application. One of the architectural component, the design engineering component, and the production specific component may be altered in the mapped file in response to at least one other of the architectural component, the design engineering component, and the production specific component being edited in the respective application. The architectural component may be editable only in the architectural design application, the design engineering component may be editable only in the design engineering application, and the production specific component may be editable only in the production specific application. The architectural design component may include at least one architectural design object, the design engineering component may include at least one design engineering object, and the production specific component may include at least one production specific object, where the at least one architectural design object may be bi-directionally linked with the at least one design engineering object and the at least one production specific object.

Example embodiments may generate a bill of materials based on at least one of the architectural design component, the design engineering component, or the production specific component. The bill of materials may be changed in response to a change in the mapped file. The mapped file may be in a binary format.

Further example embodiments of the present invention may provide a system including an architectural design application configured to generate a first file including an architectural design component, a design engineering application configured to generate a second file including a design engineering component, and a production specific application configured to generate a third file including a production specific component. The system may further include a design suite manager configured to receive at least one of the first, second, or third files and generate a mapped file including the architectural design component, the design engineering component, and the production specific component. The mapped file may be operable on at least one of the architectural design application, the design engineering application, or the production specific application.

Example embodiments of the system may further include a component marking manager configured to mark production components in response to receiving the mapped file. The design suite manager may be further configured to generate a bill of materials based on at least one of the architectural design component, the design engineering component, or the production specific component. The design suite manager may be further configured to change the bill of materials in response to a change in any one of the architectural design component, the design engineering component, and the production specific component.

Still further example embodiments of the present invention may provide an apparatus including a design suite manager configured to generate a mapped file. The mapped file may include an architectural design component generated by an architectural design application, a design engineering component generated by a design engineering application, and a production specific component generated by a production specific application, where the mapped file may be operable on each of the architectural design application, the design engineering application, and the production specific application. The mapped file may be in a binary format. The design suite manager may be configured to generate a bill of materials based on at least one of the architectural design component, the design engineering component, or the production specific component. The design suite manager may be further configured to change the bill of materials in response to a change in any one of the architectural design component, the design engineering component, and the production specific component.

In some embodiments, the design suite manager may be configured to receive a file in a first format from one of the architectural design application, the design engineering application, or the production specific application and generate a mapped file in a mapped format. The design suite manager may convert the mapped file from the mapped format to a second format that is operable on at least one of the architectural design application, the design engineering application, or the production specific application, where the second format may be different from the first. The design suite manager may be configured to change at least one of the architectural design component, the design engineering component, or the production specific component in response to a change to at least one of the architectural design component by the architectural design application, the design engineering component by the design engineering application, or the production specific component by the production specific application.

BRIEF DESCRIPTION OF THE SEVERAL VIEWS OF THE DRAWING(S)

Having thus described embodiments of the invention in general terms, reference will now be made to the accompanying drawings, which are not necessarily drawn to scale, and wherein:

DETAILED DESCRIPTION

Figure 1:
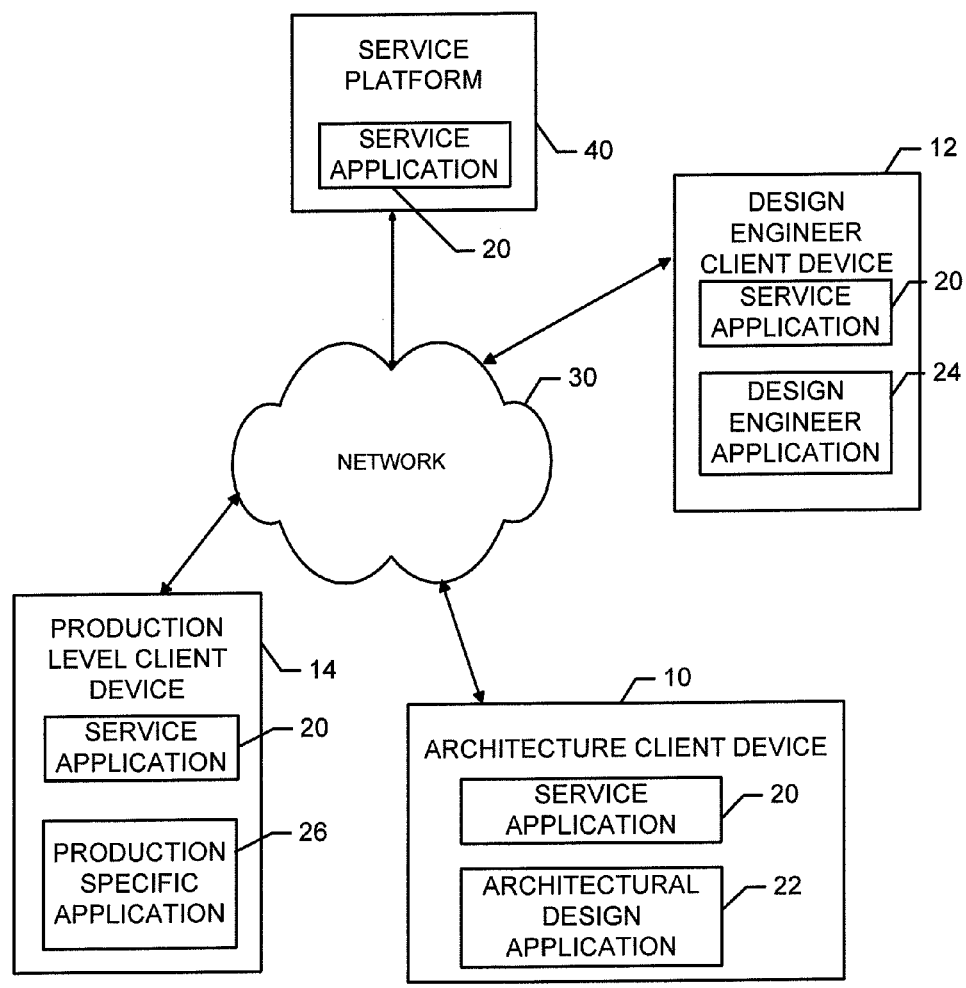
FIG. 1 is a schematic block diagram of a communication system according to an example embodiment of the present invention.

Some embodiments of the present invention will now be described more fully hereinafter with reference to the accompanying drawings, in which some, but not all embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. Furthermore, as defined herein a "computer-readable storage medium," which refers to a non-transitory storage medium (e.g., volatile or non-volatile memory device), can be differentiated from a "computer-readable transmission medium," which refers to an electromagnetic signal.

As indicated above, some example embodiments relate to the provision of a model map for workflow integration from concept to production. More specifically, some embodiments relate to the provision of a mechanism for providing a file format that may be useable in any direction and at each level of the work flow processes associated with designing and producing materials for building projects. Some embodiments may also provide an ability to create customizable objects that can be manipulated on-the-fly to enable both pre-processing and post-processing of objects. Furthermore, some embodiments may provide for "smart" components so that information regarding design features can be marked on components while the components are being processed.

Some example embodiments may be offered via a network environment so that various different terminals may access functionality associated therewith. As such, various (sometimes remotely located) client terminals may access a service platform capable of serving information to each respective client terminal in accordance with exemplary embodiments. In some cases, the service platform may host a web application that is accessible by the client terminals or may host a service application that interacts with a corresponding client application at each respective client terminal. However, in alternative embodiments, an application may be executed at one or more of the client terminals in a stand alone mode using updateable software that may run on the client terminal, without any need for a service platform. As another alternative, one of the terminals in communication with other terminals may act as the service platform hosting the service application. Other architectures for supporting deployment of example embodiments are also possible. However, an example architecture will be described in connection with FIG. 1 to illustrate one non-limiting example embodiment.

FIG. 1 illustrates a generic system diagram in which devices such as a computer terminals, which may benefit from embodiments of the present invention, are shown in an example communication environment. As shown in FIG. 1, an embodiment of a system in accordance with an example embodiment of the present invention may include one or more client terminals. In some cases, the client terminals may be associated with different entities that may interact with embodiments of the present invention. Thus, for example, an architecture client device 10, a design engineer client device 12, and a production level client device 14 may each be examples of client terminals associated with respective different entities. Each of the client terminals may be a computer, access terminal, or other device capable of executing one or more applications (e.g., service application 20 and respective different client-specific applications) according to an example embodiment of the present invention. As such, in some cases, the client terminals may even be mobile terminals such as laptop computers or smart phones.

In an example embodiment, the client terminals may be capable of communication with a network 30 that may link each client terminal to other client terminals and/or to a service platform 40. The network 30 may include a collection of various different nodes, devices or functions that may be in communication with each other via corresponding wired and/or wireless interfaces. As such, the illustration of FIG. 1 should be understood to be an example of a broad view of certain elements of the system and not an all inclusive or detailed view of the system or the network 30. Although not necessary, in some embodiments, the network 30 may be capable of supporting communication in accordance with any one or more of a number of wireless communication protocols. Alternatively, the network 30 may include communication interfaces supporting landline based or wired communication via fixed access mechanisms such as digital subscriber line (DSL), cable modems, Ethernet and/or the like. As such, the network 30 may be part of a data network, such as a local area network (LAN), a metropolitan area network (MAN), and/or a wide area network (WAN), such as the Internet. By directly or indirectly connecting the client terminals and/or the service platform 40 and other devices to the network 30, the client terminals and/or the service platform 40 may be enabled to communicate with the other devices or each other, for example, according to numerous communication protocols including Hypertext Transfer Protocol (HTTP) and/or the like, to thereby carry out various communication or other functions of the client terminals and/or the service platform 40, respectively.

In an example embodiment in which the service platform 40 is employed, the service platform 40 may be a device or node such as a server or other processing circuitry. The service platform 40 may have any number of functions or associations with various services. As such, for example, the service platform 40 may be a platform such as a dedicated server, backend server, or server bank associated with a particular information source, function or service. Thus, the service platform 40 may represent one or more of a plurality of different services or information sources. The functionality of the service platform 40 may be provided by hardware and/or software components configured to operate in accordance with known techniques for the provision of information to users of communication devices, except as modified as described herein. In an example embodiment, the service platform 40 may host, among other things, the service application 20 and interact with client terminals in a server/client relationship. However, as indicated above, each respective client terminal may run its own copy of the service application 20 in some embodiments, without any need for the service platform 40, or in combination with the service platform 40.

The service application 20 may be used to configure a respective client terminal to provide functionality for providing a model map for workflow integration from concept to production, for providing smart components and/or for providing customizable objects that can be pre-processed and post-processed according to an example embodiment. In some cases, the service application 20 may provide a web page interface that may be accessible by the client terminals to provide display features and corresponding functionalities at each respective client terminal. In an example embodiment, the service applications 20 at each client terminal may be the same. In such examples, the service applications 20 may provide for access restrictions and enablements to different functionalities and/or information sets to clients based on identity or authentication information provided by each potential user. As an alternative, different software may be provided in association with each service application 20 based on the other software (e.g., the software typically used for design and/or production related work at each respective level) to enable seamless interaction between the model map provided according to example embodiments and the other software.

The client-specific applications may include an architectural design application 22, a design engineer application 24 and/or a production-specific application 26. Each of the client-specific applications may be an application that is tailored to use for a corresponding client terminal for the performance of functionalities specific to the respective client terminals. Thus, for example, the client-specific applications such as any or all of AutoCAD®, VisionREZ®, hsbCAD®, IntelliVIEW®, IntelliBuild®, and numerous other applications may be used by the architecture client device 10, the design engineer client device 12, and/or the production level client device 14.

Figure 2:
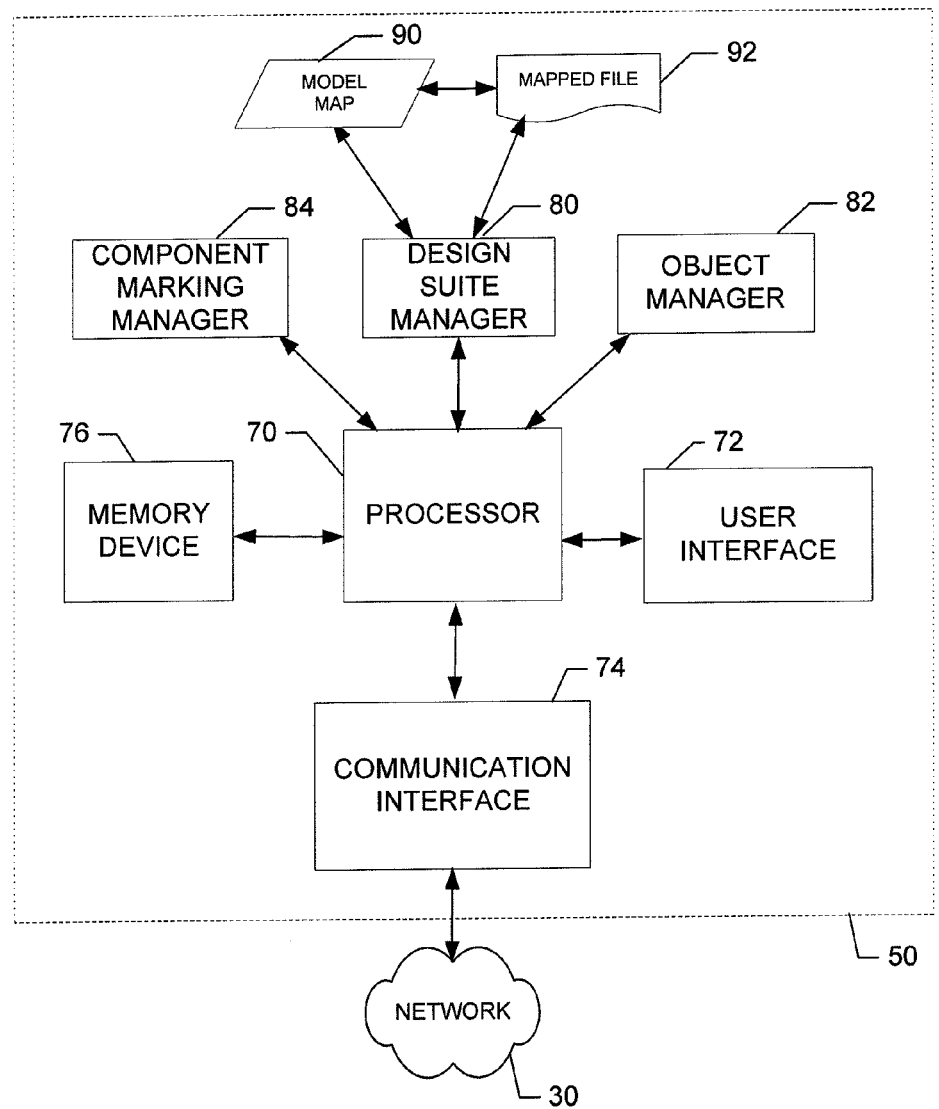
FIG. 2 is a schematic block diagram of an apparatus for providing a model map for workflow integration from concept to production according to an example embodiment of the present invention.

FIG. 2 illustrates a schematic block diagram of an apparatus for enabling the provision of a model map for workflow integration from concept to production according to an example embodiment. Some embodiments of the present invention may be embodied wholly at a single device (e.g., the client terminals or the service platform 40) or by devices in a client/server relationship. Furthermore, it should be noted that the devices or elements described below may not be mandatory and thus some may be omitted in certain embodiments. An example embodiment of the invention will now be described with reference to FIG. 2, in which certain elements of an apparatus 50 for providing a model map for workflow integration from concept to production are displayed. The apparatus 50 of FIG. 2 may be employed, for example, on a client terminal (e.g., the architecture client device 10, the design engineer client device 12, and/or the production level client device 14) and/or the service platform 40 or any of a variety of other devices. The apparatus 50 may therefore be a platform for execution of the service application 20 to the extent that such execution performs the functionality described herein. Thus, for example, the components described in connection with FIG. 2 may form the structure or means by which various functionalities of embodiments of the present invention and functionalities of the service application 20 is executed.

Referring now to FIG. 2, an apparatus 50 for providing a model map for workflow integration from concept to production is provided. The apparatus 50 may include or otherwise be in communication with a processor 70, a user interface 72, a communication interface 74 and a memory device 76. The memory device 76 may include, for example, one or more volatile and/or non-volatile memories. In other words, for example, the memory device 76 may be an electronic storage device (e.g., a computer readable storage medium) comprising gates or other structure configured to store data (e.g., bits) that may be retrievable by a machine (e.g., a computing device). The memory device 76 may be configured to store information, data, applications, instructions or the like for enabling the apparatus to carry out various functions in accordance with example embodiments of the present invention. For example, the memory device 76 could be configured to buffer input data for processing by the processor 70. Additionally or alternatively, the memory device 76 could be configured to store instructions for execution by the processor 70. In some embodiments, the memory device 76 may also or alternatively store content items (e.g., structural engineer design drawings, architectural CAD drawings, production related drawings, objects associated with any of the drawings described previously and/or the like).

The processor 70 may be embodied in a number of different ways. For example, the processor 70 may be embodied as one or more of various processing means such as a coprocessor, a microprocessor, a controller, a digital signal processor (DSP), a processing element with or without an accompanying DSP, or various other processing devices including integrated circuits such as, for example, an ASIC (application specific integrated circuit), an FPGA (field programmable gate array), a microcontroller unit (MCU), a hardware accelerator, a special-purpose computer chip, processing circuitry, or other similar hardware processing devices. In an example embodiment, the processor 70 may be configured to execute instructions stored in the memory device 76 or otherwise accessible to the processor 70. Alternatively or additionally, the processor 70 may be configured to execute hard coded functionality. As such, whether configured by hardware or software methods, or by a combination thereof, the processor 70 may represent an entity (e.g., physically embodied in circuitry) capable of performing operations according to embodiments of the present invention while configured accordingly. Thus, for example, when the processor 70 is embodied as an ASIC, FPGA or the like, the processor 70 may be specifically configured hardware for conducting the operations described herein. Alternatively, as another example, when the processor 70 is embodied as an executor of software instructions, the instructions may specifically configure the processor 70 to perform the algorithms and/or operations described herein when the instructions are executed. However, in some cases, the processor 70 may be a processor of a specific device (e.g., a client terminal or service platform 40) adapted for employing embodiments of the present invention by further configuration of the processor 70 by instructions for performing the algorithms and/or operations described herein. In some cases, the processor 70 may include, among other things, a clock, an arithmetic logic unit (ALU) and logic gates configured to support operation of the processor 70.

Meanwhile, the communication interface 74 may be any means such as a device or circuitry embodied in either hardware, or a combination of hardware and software that is configured to receive and/or transmit data from/to a network and/or any other device or module in communication with the apparatus 50. In this regard, the communication interface 74 may include, for example, an antenna (or multiple antennas) and supporting hardware and/or software for enabling communications with a wireless communication network. In some environments, the communication interface 74 may alternatively or also support wired communication. As such, for example, the communication interface 74 may include a communication modem and/or other hardware/software for supporting communication via cable, digital subscriber line (DSL), universal serial bus (USB) or other mechanisms.

The user interface 72 may be in communication with the processor 70 to receive an indication of a user input at the user interface 72 and/or to provide an audible, visual, mechanical or other output to the user. As such, the user interface 72 may include, for example, a keyboard, a mouse, a joystick, a display, a touch screen, soft keys, a microphone, a speaker, or other input/output mechanisms. In an example embodiment in which the apparatus 50 is embodied as a server or some other network devices (e.g., the service platform 40), the user interface 72 may be limited, provided remotely (e.g., from a client terminal or another device) or eliminated. However, in an embodiment in which the apparatus is embodied as a client terminal, the user interface 72 may include, among other devices or elements, any or all of a speaker, a microphone, a display, and a keyboard or the like.

In an example embodiment, the processor 70 may be embodied as, include or otherwise control a design suite manager 80, an object manager 82, and/or a component marking manager 84. The design suite manager 80, the object manager 82, and the component marking manager 84 may each be any means such as a device or circuitry operating in accordance with software or otherwise embodied in hardware or a combination of hardware and software (e.g., processor 70 operating under software control, the processor 70 embodied as an ASIC or FPGA specifically configured to perform the operations described herein, or a combination thereof) thereby configuring the device or circuitry to perform the corresponding functions of the design suite manager 80, the object manager 82, and the component marking manager 84, respectively, as described below. Thus, in examples in which software is employed, a device or circuitry (e.g., the processor 70 in one example) executing the software forms the structure associated with such means.

In an example embodiment, the design suite manager 80 may be configured to provide a model map 90 that allows conversion of different file formatted building design/production related documents into a common and interchangeably useable format. In some embodiments, the design suite manager 80 may define an application programming interface (API) that enables the production of a file (e.g., the mapped file 92) that is operable in connection with the existing software applications that are used by each of the parties involved in the process of taking a building from conception to production. In other words, the design suite manager 80 may be configured to provide file conversion services to convert a file in any one of a selected group of formats into a binary file format that is translatable back into each of the selected group of formats. As such, client terminals associated with various levels of a particular project may each be enabled to use the design suite manager 80 to translate work done on each respective client terminal into a universally operable mapped file 92. The model map 90 may include code that plugs into each respective client-specific application to map objects in each respective client-specific application to a corresponding abstract object that includes conversion parameters to map the abstract object into others of the respective client-specific applications. Accordingly, the client-specific applications are integrated via the model map 90 to enable the production of the mapped file 92 in which all features therein are mapped to respective features of each respective client-specific application that the model map 90 is configured to support.

In an example embodiment, the design suite manager 80 may include plug-ins or modules for each program to be supported (e.g., each client-specific application associated with each level from concept to production that is represented). Each client-specific application may produce a respective component of a mapped file created by the model map 90. The plug-ins or modules may provide building data input to the model map 90 defining objects in a component of a specific one of the client specific applications (e.g., the architectural design application 22). The model map 90 may then convert the objects into corresponding abstractualized objects in the format of the mapped file 92. The model map 90 may also provide a mapping of the abstractualized objects into corresponding objects in the respective formats of the other client-specific applications supported by the design suite manager 80 (e.g., the design engineer application 24 and/or the production-specific application 26). As such, the mapped file 92 may include a collection of abstractualized objects from each of the respective components that can be mapped for output into any of the supported client-specific applications.

Objects in the mapped file 92 (e.g., the abstractualized objects) may remain anchored to a common lexicon via the model map 90 that may also be used to convert such objects into any desirable output format. Each of the respective client terminals (e.g., the architecture client device 10, the design engineer client device 12, and/or the production level client device 14) may therefore be utilized to operate respective different client-specific applications (e.g., the architectural design application 22, the design engineer application 24 and/or the production-specific application 26, respectively) and also produce the mapped file 92 using the model map 90, with each of the architectural design application 22, the design engineering application 24, and the production specific application 26 providing a respective component thereof. The mapped file 92 may then be communicated to any other one of the client terminals. Using the model map 90, the mapped file 92, which may include any changes made at the prior level, may be converted into a format for use with the corresponding client-specific application of the corresponding client terminal receiving the mapped file 92. Changes made by the other one of the client terminals to a local file generated based on the mapped file 92 may be reflected in a modified local file that is then also mapped (e.g., via the model map 90) into a mapped file (e.g., an updated mapped file). The updated mapped file may then be shared with other client terminals and either the originating client terminal (e.g., back up the chain) or a downstream client terminal may be enabled to generate a local file for potential modification based on the updated mapped file. All further updates may each be reflected in new updated mapped files, all of which are generated based on the model map 90. Each updated mapped file can be shared with all other levels (regardless of direction of work flow and without necessarily needing intermediate level input) and conversion may continue to be made based on the model map 90 to continually ensure interoperability of each mapped file produced.

In an example embodiment, the service application 20 may include buttons, menu option selections or other mechanisms by which conversion and distribution of files and conduct of model map functionality may be accomplished. In an example embodiment, plug-in modules associated with the client-specific applications may add a button or other option for generating the mapped file 92, for distributing the mapped file 92 and/or for recovering locally useable data (e.g., client-specific application data based on the mapped file 92) from each respective mapped file. Accordingly, users may be enabled to work in a familiar environment for them (e.g., the client-specific applications), but also be provided with an ability to interact with other designers, engineers or fabricators using their own respective familiar environments via a universally applicable intermediate file formatting mechanism.

By employing the model map 90, interoperability may be provided for changes made to building related drawings that are modified or generated at any level. Thus, changes made at any level may be recognized and reacted to at any other level. Moreover, the universal nature of the mapped file 92 may enable users to tailor specific optional modifications of specific objects to be initiated based on changes made at other levels. For example, if a designer changes the location of a bathroom or a kitchen appliance in the architectural design component, the corresponding plumbing features and structural supports for individual objects that are added or moved at a design stage may be added easily or even automatically at the structural engineer's level in the design engineering component. In this regard, for example, when the mapped file 92 is received, structural features that correspond to certain design features may be automatically generated or generated easily via menu options that are generated for objects that have been added or modified. Similarly, if a change is made with respect to building materials or code requirements in the design engineering component that impacts the fabricator, the fabricator may make such changes to the production specific component in the mapped file 92. Indications of the changes may be made automatically at other levels when the mapped file 92 is received in its updated state. The structural engineers and/or designers may then make any appropriate changes based on the requirements that impacted the fabricator.

In some embodiments, objects and structures in each component may be bi-directionally linked and synchronized with each other. For example, a structural wall from a design engineering component may be bi-directionally linked and synchronized with an architectural wall from an architectural design component. The structural wall typically refers to the load bearing components of a structure that resist such forces as wind, gravity, seismic motion, etc. The architectural wall typically refers to items modeled as non-structural sheathing, siding, etc and a cavity or component for the structural wall to reside. Accordingly, changes made in an architectural model component (e.g., relating to changes in the size of a window, relocation of a door, etc.) may impact the structural model component and provide impacts both upstream and downstream. Accordingly, the mapped file 92 may be used to synchronize cloned structures and/or objects in various models (e.g., the architectural design component, the design engineering component, and the production specific component). By synchronizing cloning, the bi-directional linkages may be maintained so that following issues that arise in typical model development may be handled:

(1) There needs to be many structural walls for one architectural wall.

a. A wall framed in two or more horizontal wall panels.
b. A wall framed in two or more vertical wall panels.
(2) There needs to be one structural wall for many architectural walls.
 a. For design options the wall has been split in two by the architect.
 b. For delivery to the job site, only one wall panel will be produced.
(3) Using design options, the architectural wall needs to be framed more than one way.
 a. The house is built with SIPS versus stick framing. The SIPS are more energy efficient, the stick framing is cheaper.
 b. The same house is built in a high and low wind load region. The architectural walls do not change but the structural framing is different due to wind load.
(4) The cloning and linking of the structural wall allows for different visual appearance, geometry and data to be used.
 a. The structural walls show how corners are framed where the architectural walls display mitered corners.
 b. The structural wall contains load information that the architectural wall does not.
(5) If the architectural wall is modified, the linked structural wall or walls can be updated automatically to match the changes.

Figure 3:
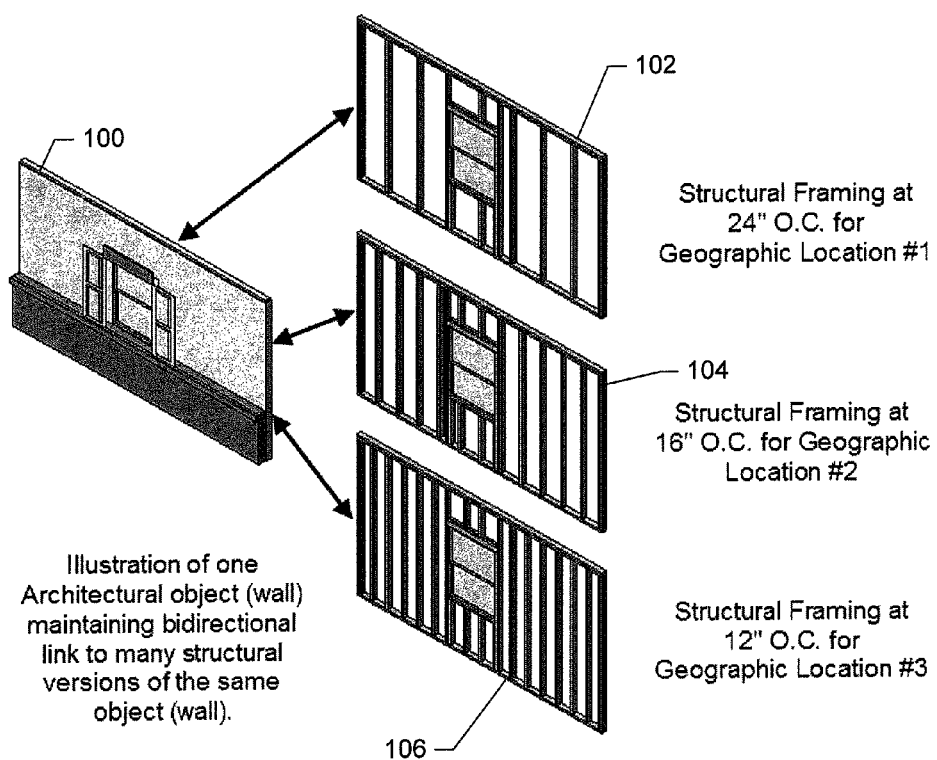
FIG. 3 illustrates an architectural object that is linked to three different cloned walls that each represent structural framing for respective different geographic locations according to an example embodiment of the present invention.

FIG. 3 illustrates an example of an architectural object 100 (in this case a wall) in an architectural design component that is linked to three different cloned walls that each represent structural framing for respective different geographic locations. In this regard, for example, a first cloned wall 102 may represent structural framing for a first geographic location where the studs are twenty-four inches apart on center. The second cloned wall 104 may represent structural framing for a second geographic location where the studs are sixteen inches apart on center. The third cloned wall 106 may represent structural framing for a third geographic location where the studs are twelve inches apart on center. The bi-directional linkage provided between the architectural object 100 in the architectural design component and the cloned structures (e.g., the first, second and third cloned walls 102, 104 and 106) may provide for synchronization of the cloned structures and the architectural object 100.

Version control may be accomplished by any suitable mechanism in order to ensure all parties are aware of the most recent version of any particular mapped file. Moreover, in some cases, suggestions, different options or even intermediate or final approvals or other authentication or authorization tasks may be incorporated into the mapped files via management of version control and/or the use of overlays and electronic signatures. Control over building materials and the design, engineering and fabrication processes that are associated therewith may therefore be made much more flexible such that users of the service application 20 may collaborate in ways not previously possible.

As indicated above, in some embodiments, the apparatus 50 may further include the object manager 82. The object manager 82 may be configured to define objects, such as connection-related components, that are usable for pre-processing and post-processing. As such, connection objects may be customized within application files. Furthermore, the connection objects may be manipulated on-the-fly. Thus, for example, if a deck application is used to design a deck that can be attached to the side of a structure such as a home, the joists and planks that would normally be included in the design plan may also include connection objects (e.g., screws, nails, joist hangers, deck fasteners, etc.) that may be customized and/or modified not only before, but during the design phase.

In some example embodiments, a traditional point of sale for the hardware associated with a specific building project like a deck addition project is a lumber yard or building supply center. Builders may not only need a list of the timbers of various sizes and dimensions, but may also desire to quantify the connections therebetween. The connection options may relate to situations including, but not limited to:
(1) decking or planking connections to the top of joists, which can include screws, nails, or specialty hidden fasteners;
(2) joists that carry the decking and are fastened directly to the face of wall ledgers, beam faces, or rest on top of beams;
(3) beams that carry joists and are fastened to the top of columns or posts,
(4) columns or posts fastened to foundation piers using post bases or other fastening technology;
(5) stair treads attached to stringers, which may then be attached to the deck and the base on which it rests;
(6) hand railings of various configurations requiring connections of posts to beams, rails to posts, and spindles to rails; and
(7) connectors requiring additional fasteners to attach the connectors to a timber.

With the advent of three-dimensional (3D) CAD technology, numerous different design applications are being developed. By providing customized connection objects that can be modified on-the-fly, such design applications may be markedly improved in relation to their utility to parties at all levels of the building process. Graphical objects corresponding to connection objects may become selectable objects within various design programs. After selecting a connection object (e.g., a joist hanger), the selected object may be modified in relation to its size, connection options, orientation, materials, etc. The connection objects may also be selected to permit modification of the viewing angle of such objects. Other manipulations of the connection objects may include manipulations related to performing custom operations such as adding desired tooling such as cuts or notches at beams at various locations (e.g., "T" intersections where joists terminate into beams, end locations where bottoms of posts terminate on tops of footings, or cross intersections where beams rest on top of posts). Other manipulations may include selection of correct bolt or screw lengths based on the thickness of timbers being attached or modifications made based on the geometry presented for particular mitred beam connections.

The connection objects provided by the object manager 82 may, in some cases, be provided via a scripting language (e.g., a tools scripting language (TSL)), that enables users to modify the connection objects themselves. As such, users of client terminals may modify connection objects based on their specific desired or requirements so that a very accurate and detailed bill of materials (BOM) may be generated for contractor, builder or consumer use. In some embodiments, the scripting language used may enable specific descriptors of connection objects to be queried so that the composition of the connection objects may be examined. The definition of various features of the connection objects may enable the corresponding properties to be derived and modified accordingly. Custom versions of the connection objects may then be generated based on the user's needs and/or desires. Thus, for example, the geometry of beams in use may be considered for selection of hangers and/or brackets that are angled or otherwise designed for situations the user is likely to encounter. The custom connection objects may then be saved to a library of connection objects for subsequent use in design projects or for modification to provide other additional or replacement custom connection objects.

Example embodiments of the present invention may provide a mechanism by which files from various, typically incompatible applications may be shared across platforms such as an architectural design application, a design engineering application, and a production specific application among others. A flowchart illustrating operations performed by, or in relation to a method of an example embodiment is presented in the flowchart of FIG. 4. It will be understood that each block of the flowchart, and combinations of blocks in the flowchart, may be implemented by various means, such as hardware, a computer program product comprising a computer readable medium storing program instructions (e.g., software, firmware, and the like), processor, circuitry and/or other device. For example, one or more of the procedures described above may be embodied by computer program instructions. In this regard, the computer program instructions which embody the procedures described above may be stored by a memory device of an apparatus employing an embodiment of the present invention and executed by a processor in the apparatus, such as processor 70 of FIG. 2. As will be appreciated, any such computer program instructions may be loaded onto a computer or other programmable apparatus (e.g., hardware) to produce a machine, such that the resulting computer or other programmable apparatus embody means for implementing the functions specified in the flowchart block(s). These computer program instructions may also be stored in a computer-readable memory (e.g., non-transient memory 76) that may direct a computer or other programmable apparatus to function in a particular manner, such that the instructions stored in the computer-readable memory produce an article of manufacture the execution of which implements the function specified in the flowchart block(s). The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart block(s).

Accordingly, blocks of the flowchart support combinations of means for performing the specified functions, and combinations of operations for performing the specified functions. It will also be understood that one or more blocks of the flowchart, and combinations of blocks in the flowcharts, can be implemented by special purpose hardware-based computer systems which perform the specified functions, or combinations of special purpose hardware and computer instructions.

In an example embodiment, an apparatus for performing the methods of FIG. 4 may comprise processing circuitry (e.g., processor 70) configured to perform some or each of the operations (410-430) described below. The processing circuitry may, for example, be configured to perform the operations (410-430) by performing hardware implemented logical functions, executing stored instructions, or executing algorithms for performing each of the operations. Additionally or alternatively, the apparatus may comprise means for performing one or more of the operations described above. In this regard, according to an example embodiment, examples of means for performing operations 400-450 may comprise, for example, the processor 70, memory 76 and/or a device or circuit for executing instructions or executing an algorithm for processing information as described further below.

Figure 4:
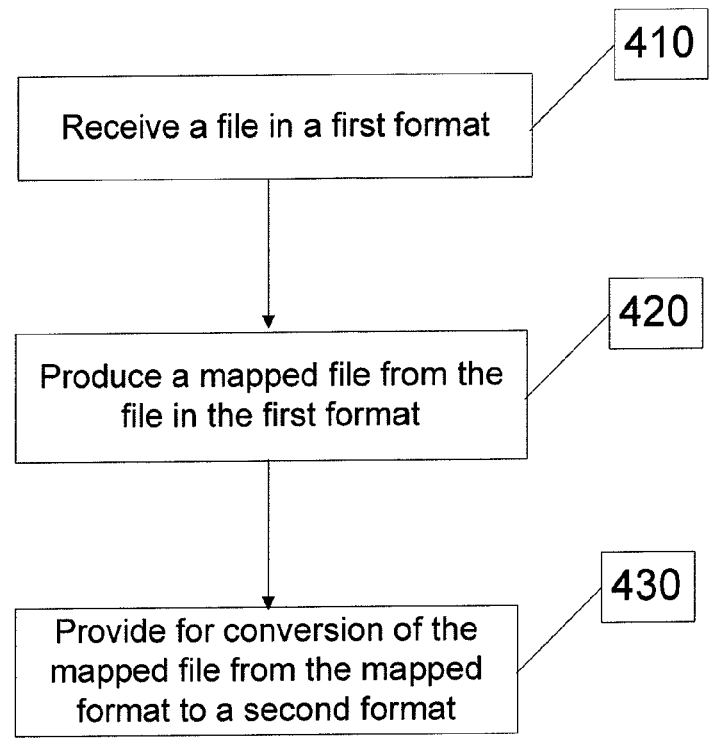
FIG. 4 is a flowchart of a method of providing a model map for workflow integration according to an example embodiment of the present invention.

The example embodiment illustrated by the flowchart of FIG. 4 may begin with receiving a file in a first format at 410, where the first format is supported by a first application that may be an architectural design application, a design engineering application, or a production specific application. A mapped file may be produced from the file in the first format at 420, where the mapped file is in a mapped format. The mapped file may be converted from the mapped format to a second format at 430, where the second format is supported by a second application which may be an architectural design application, a design engineering application, or a production specific application and the second format may be different from the first format.

In some embodiments, the apparatus 50 may further (or alternatively) include the component marking manager 84. The component marking manager 84 may be configured to enable the provision of smart components. In this regard, the component marking manager 84 may provide tags or other metadata to be associated with specific components such that, when such components are processed (e.g., for cutting or assembly), specific markings are placed on the components according to the tags or metadata. As an example, if a structural wall drawing shows a window at a particular location, certain pieces of lumber and/or sheathing may be marked to indicate the location of the window. Thus, for example, markings related to instructions or other indications of where cutouts or other features are to be provided may be included on specific components. Markings may also be used to indicate arrangement, ordering or orientation of components in some cases.

Since these components have markings thereon that may facilitate or otherwise assist other individuals in assembling, cutting or otherwise preparing the components for market, the components may be said to communicate certain information to the individuals. As such, the components may be considered to be smart components as the components themselves can tell a builder where they belong and/or in what manner they are to be assembled or modified before, during or even after assembly. By marking components during the cutting or assembly process, indications regarding additional actions to be taken with respect to the components may enable builders or fabricators to avoid mistakes in assembly, reduce waste, and enhance quality control.

Although the smart components need not be used in connection with the model map 90 (e.g., in embodiments where only the component marking manager 84 is employed), the model map 90 may facilitate the use of smart components. In this regard, for example, a structural engineer may be enabled to define specific locations for cutouts or other features in a structural wall. The structural wall may be defined in a file including the components thereof. Tags or metadata may be automatically or manually attached to individual components based on the connections, orientations, lengths, and other physical characteristics needed in components to actually build the structural wall. The tags or metadata associated with the components may be passed along with the components in the mapped file 92 and may be provided to the software used by fabricators for cutting and/or assembling the structural wall. The component marking manager 84 may, responsive to opening the mapped file 92 and identifying components to be marked, provide information indicative of marking locations on corresponding components to a marking device or printer associated with equipment that processes the components. The lumber and/or sheathing that will be used to physically embody the features of the structural wall may then be marked when the lumber and/or sheathing is cut or processed prior to or during assembly.

In an example embodiment, a marking device or printer may be incorporated into a linear saw or other cutting device. For example, a high speed printing device having a print head and ink or some other marking mechanism may be incorporated into the saw. As yet another alternative, a truss assembler or other robotic component handler may have a printing device incorporated therein and, responsive to instructions from the component marking manager 84, smart lumber or other components may be marked during movement of the smart lumber or other components. The equipment with which the marking device is associated (e.g., the saw, truss assembler, component handler, etc.) may include its own machine controller and corresponding software and hardware for executing an application that configures the marking device to provide markings on the components at appropriate locations. Thus, for example, the marking device may operate responsive to instructional direction from a machine controller executing a program for marking the smart components according to the tags and/or metadata associated with each respective component.

Figure 5:
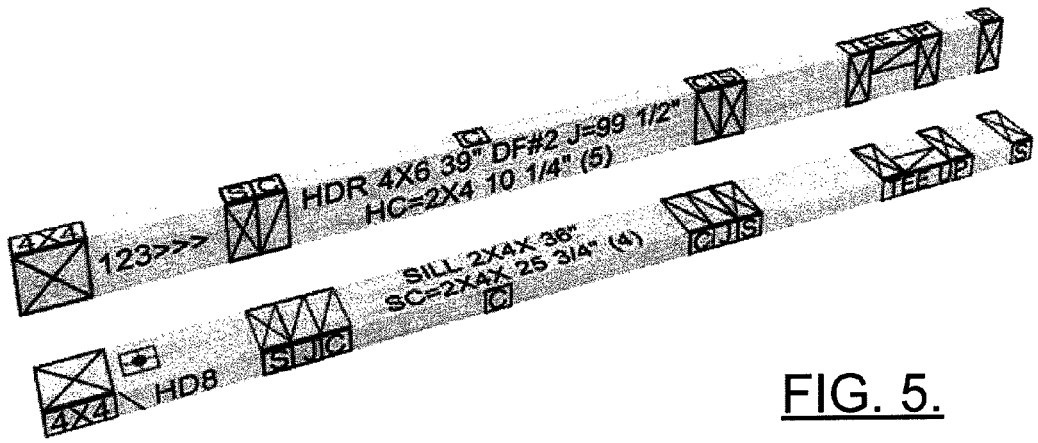
FIG. 5 illustrates a perspective view of smart lumber according to an example embodiment of the present invention.
Figure 6:
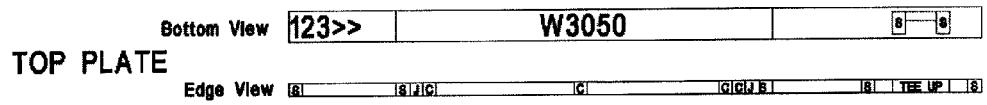
FIG. 6 illustrates top, bottom and respective side views of smart lumber according to an example embodiment of the present invention.
Figure 6:
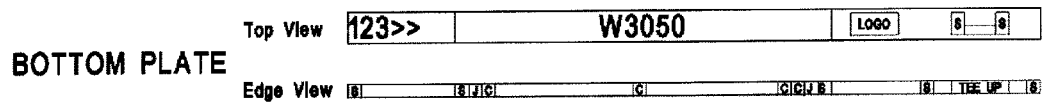
Figure 7:
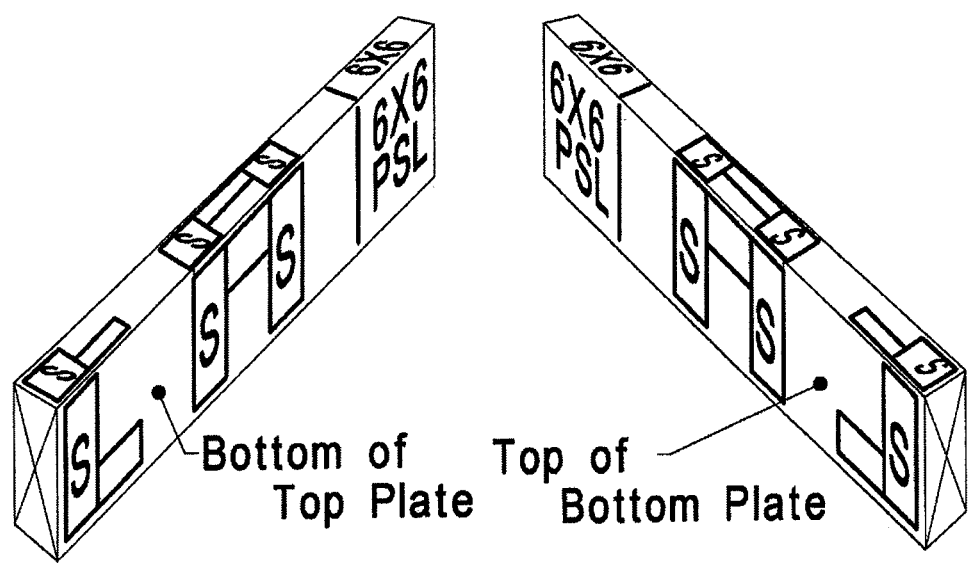
FIG. 7 illustrates a perspective view of markings provided on a piece of smart lumber according to an example embodiment of the present invention.

FIGS. 4-6 illustrate non-limiting examples of smart lumber with markings provided thereon. As such, it should be understood that some example embodiments may employ different markings than those shown in FIGS. 5-7, with different, additional or even less markings in some examples. Referring now to FIG. 5, a perspective view of top and side views and bottom and side views of smart lumber. As shown in FIG. 5, various connection locations for the piece of smart lumber are shown. Additionally, instructive and/or informative markings may provide general information regarding the type of member the piece of lumber is and/or its orientation or position. FIG. 6 illustrates a similar example to that of FIG. 5 except that individual side and top or bottom views are shown for each member instead of providing a perspective view. Example embodiments can utilize the markings on smart lumber to support offsite manufacturing for full fabrication in which markings may be provided to reflect the preassembly of entire components upstream during the manufacturing process such as for door or window opening subassemblies or connection assemblies. Some embodiments may also support offsite manufacturing for partial fabrication in which markings are provided to reflect the placement of exploded components using subassembly part names generated by the component marking manager 84 during a design phase. Some embodiments may also support onsite assembly (e.g., stick framed or site framed) in which markings may be provided to present complete instructions for all associated parts to an assembly for cutting and assembly offsite, such as at a job location or some other assembly point. FIG. 7 illustrates a perspective view of smart lumber employing mirrored plates. As can be seen from FIG. 7, locations of various connectors have been printed onto the piece of smart lumber. Moreover, the markings on the bottom face and top plate have been provided in a mirrored fashion so that as subassemblies are aligned between the plates on the framing surface, the face sensitive blocks shown in FIG. 7 may be aligned.

In some embodiments, various activities or methods associated with operation of the apparatus 50 may be controlled via a computer program product. As such, the activities or methods may be implemented by various means, such as hardware, firmware, processor, circuitry and/or other devices associated with execution of software including one or more computer program instructions. For example, one or more of the procedures described above may be embodied by computer program instructions. In this regard, the computer program instructions which embody the procedures described above may be stored by a memory device of the client terminal or server platform and executed by a processor of the client terminal or server platform. As will be appreciated, any such computer program instructions may be loaded onto a computer or other programmable apparatus (e.g., hardware) to produce a machine, such that the instructions which execute on the computer or other programmable apparatus create means for implementing the functions specified. These computer program instructions may also be stored in a computer-readable memory that may direct a computer or other programmable apparatus to function in a particular manner, such that the instructions stored in the computer-readable memory produce an article of manufacture including instruction means which implement the functions specified. The computer program instructions may also be loaded onto a computer or other programmable apparatus to cause a series of operations to be performed on the computer or other programmable apparatus to produce a computer-implemented process such that the instructions which execute on the computer or other programmable apparatus implement the functions specified.

An apparatus for performing a method according to any of the activities described above may comprise a processor (e.g., the processor 70) configured to perform some or each of the operations described herein. The processor may, for example, be configured to perform the operations by performing hardware implemented logical functions, executing stored instructions, or executing algorithms for performing each of the operations.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the present disclosure and any attachments thereto. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the present disclosure and any attachments thereto. Although specific terms are employed herein, they are used in a generic and descriptive sense only and not for purposes of limitation.

That which is claimed:

1. A method comprising:
    receiving a file in a first format, wherein the first format is supported by a first application chosen from the group consisting of: an architectural design application, a design engineering application, and a production specific application;
    producing a mapped file from the file in the first format, wherein the mapped file is in a mapped format, wherein the mapped file comprises an architectural design component including at least one architectural design object, a design engineering component including at least one design engineering object, and a production specific component including at least one production specific object; and
    providing for conversion of the mapped file from the mapped format to a second format via a processor, wherein the second format is supported by a second application chosen from the group consisting of: an architectural design application, a design engineering application, and a production specific application, wherein the second format is different from the first format, and wherein the at least one architectural design object is bi-directionally linked with the at least one design engineering object and the at least one production specific object.

2. The method according to claim 1, wherein the architectural component is editable in the architectural design application, the design engineering component is editable in the design engineering application, and the production specific component is editable in the production specific application.

3. The method according to claim 2, wherein one of the architectural component, the design engineering component, and the production specific component is altered in the mapped file in response to at least one other of the architectural component, the design engineering component, or the production specific component being edited in the respective application.

4. The method according to claim 2, wherein the architectural component is only editable in the architectural design application, the design engineering application is only editable in the design engineering application, and the production specific component is only editable in the production specific application.

5. The method according to claim 1, further comprising generating a bill of materials based on at least one of the architectural design component, the design engineering component, or the production specific component.

6. The method according to claim 5, further comprising changing the bill of materials in response to a change in the mapped file.

7. The method according to claim 1, wherein the mapped format is a binary file format.

8. The method of claim 1, wherein the mapped file comprises a building information model.

9. A system comprising:
an architectural design application configured to generate a first file including an architectural design component including at least one architectural design object;
a design engineering application configured to generate a second file including a design engineering component including at least one design engineering object;
a production specific application configured to generate a third file including a production specific component including at least one production specific object; and
a design suite manager configured to receive at least one of the first, second, or third files and to generate a mapped file comprising the architectural design component, the design engineering component, and the production specific component, wherein the at least one architectural design object is bi-directionally linked with the at least one design engineering object and the at least one production specific object.

10. The system according to claim 9, wherein the mapped file is operable on at least one of the architectural design application, the design engineering application, or the production specific application.

11. The system according to claim 10, further comprising a component marking manager, wherein the component marking manager is configured to mark production components in response to receiving the mapped file.

12. The system according to claim 9, wherein the design suite manager is further configured to generate a bill of materials based on at least one of the architectural design component, the design engineering component, or the production specific component.

13. The system according to claim 12, wherein the design suite manager is configured to change the bill of materials in response to a change in any one of the architectural design component, the design engineering component, and the production specific component.

14. An apparatus comprising:
a design suite manager configured to generate a mapped file comprising:
an architectural design component including at least one architectural design object generated by an architectural design application,
a design engineering component including at least one design engineering object generated by a design engineering application, and
a production specific component including at least one production specific component object generated by a production specific application,
wherein the mapped file is operable on each of the architectural design application, the design engineering application, and the production specific application, and
wherein the at least one architectural design object is bi-directionally linked with the at least one design engineering object and the at least one production specific object.

15. The apparatus according to claim 14, wherein the mapped file is in a binary file format.

16. The apparatus according to claim 14, wherein the design suite manager is further configured to generate a bill of materials based on at least one of the architectural design component, the design engineering component, or the production specific component.

17. The apparatus according to claim 16, wherein the design suite manager is configured to change the bill of materials in response to a change in any one of the architectural design component, the design engineering component, or the production specific component.

18. The apparatus according to claim 14, wherein the design suite manager is configured to receive a file in a first format from one of the architectural design application, the design engineering application, or the production specific application, to generate the mapped file in a mapped format, and to convert the mapped file from the mapped format to a second format that is operable on at least one of the architectural design application, the design engineering application, or the production specific application, wherein the second format is different from the first format.

19. The apparatus according to claim 14, wherein the design suite manager is configured to change at least one of the architectural design component, the design engineering component, or the production specific component in response to a change in at least one of the architectural design component by the architectural design application, the design engineering component by the design engineering application, or the production specific component by the production specific application.

* * * * *